United States Patent
Lai et al.

(10) Patent No.: US 11,101,307 B2
(45) Date of Patent: Aug. 24, 2021

(54) IMAGE SENSOR HAVING STACKED CONFORMAL FILMS

(71) Applicant: TAIWAN SEMICONDUCTOR MANUFACTURING COMPANY LTD., Hsinchu (TW)

(72) Inventors: Chih-Yu Lai, Tainan (TW); Min-Ying Tsai, Kaohsiung (TW); Yeur-Luen Tu, Taichung (TW); Hai-Dang Trinh, Hsinchu (TW); Cheng-Yuan Tsai, Hsin-Chu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/202,777

(22) Filed: Nov. 28, 2018

(65) Prior Publication Data

US 2019/0109162 A1  Apr. 11, 2019

Related U.S. Application Data

(62) Division of application No. 15/072,887, filed on Mar. 17, 2016, now Pat. No. 10,163,949.

(51) Int. Cl.
*H01L 27/146* (2006.01)

(52) U.S. Cl.
CPC ...... *H01L 27/1462* (2013.01); *H01L 27/1463* (2013.01); *H01L 27/1464* (2013.01);
(Continued)

(58) Field of Classification Search
CPC ............. H01L 27/1462; H01L 27/1464; H01L 27/14685; H01L 27/1463; H01L 27/14654; H01L 27/146–14641
See application file for complete search history.

(56) References Cited

U.S. PATENT DOCUMENTS

| 8,445,950 B2 | 5/2013 | Iida et al. |
| 2011/0156186 A1 | 6/2011 | Iida et al. |

(Continued)

FOREIGN PATENT DOCUMENTS

| CN | 104425526 A | 3/2015 |
| CN | 104517981 A | 4/2015 |

(Continued)

OTHER PUBLICATIONS

Notice of Allowance with English Translation dated Aug. 19, 2019 issued by Korean Intellectual Property Office for counterpart application 10-2016-0140103.

(Continued)

*Primary Examiner* — Kevin Parendo
(74) *Attorney, Agent, or Firm* — WPAT, P.C., Intellectual Property Attorneys; Anthony King

(57) ABSTRACT

An image sensor device is disclosed. The image sensor device includes: a substrate having a front surface and a back surface; a radiation-sensing region formed in the substrate; an opening extending from the back surface of the substrate into the substrate; a first metal oxide film including a first metal, the first metal oxide film being formed on an interior surface of the opening; and a second metal oxide film including a second metal, the second metal oxide film being formed over the first metal oxide film; wherein the electronegativity of the first metal is greater than the electronegativity of the second metal. An associated fabricating method is also disclosed.

20 Claims, 10 Drawing Sheets

(52) U.S. Cl.
CPC .. *H01L 27/14654* (2013.01); *H01L 27/14685* (2013.01); *H01L 27/14627* (2013.01); *H01L 27/14636* (2013.01); *H01L 27/14689* (2013.01)

(56) References Cited

U.S. PATENT DOCUMENTS

| | | |
|---|---|---|
| 2014/0333515 A1 | 11/2014 | In et al. |
| 2015/0061062 A1* | 3/2015 | Lin .................. H01L 27/14685 257/432 |
| 2015/0091121 A1 | 4/2015 | Manda et al. |
| 2016/0253014 A1 | 9/2016 | Yang |
| 2017/0046006 A1 | 2/2017 | Kim et al. |
| 2017/0133319 A1* | 5/2017 | Patil .................... H01L 23/5256 |
| 2018/0130835 A1 | 5/2018 | Manda et al. |
| 2019/0103424 A1 | 4/2019 | Lin et al. |

FOREIGN PATENT DOCUMENTS

| | | |
|---|---|---|
| JP | 2009218480 | 9/2009 |
| JP | 2011138905 | 7/2011 |
| KR | 20150026992 | 3/2015 |
| KR | 20150035397 | 4/2015 |
| TW | 201503085 A | 1/2015 |
| TW | 201706808 A | 2/2017 |

OTHER PUBLICATIONS

Office Action and Search Report dated Dec. 17, 2018 issued by Korean Intellectual Property Office for counterpart application 9-5-2018-086601332.
US Patent Publication No. 20110156186 is the corresponding Translation of Foreign Patent Document JP2011138905.
US Patent Publication No. 20150061062 is the corresponding Translation of Foreign Patent Document KR20150026992.
US Patent Publication No. 20150091121 is the corresponding Translation of Foreign Patent Document KR20150035397.
Office Action and Search Report dated May 22, 2019 issued by Chinese National Intellectual Property Office for counterpart application 201611248438.7.
Foreign Patent Document CN104425526A is a family patent to US Patent Publication 20150061062.
Foreign Patent Document CN104517981A is a family patent to US Patent Publication 20150091121.
Office Action and Search Report dated May 7, 2019 issued by Taiwan Intellectual Property Office for counterpart application No. 107128832.
English Abstract Translation of Office Action and Search Report.
US Patent Publication 20140333515 is the counterpart application to Foreign Patent Document TW201503085A.
US Patent Publication 20170046006 is the counterpart application to Foreign Patent Document TW201706808A.
Final Rejection dated Jul. 2, 2019 issued by Korean Intellectual Patent Office for counterpart application 10-2016-0140103.

* cited by examiner

IMAGE SENSOR HAVING STACKED CONFORMAL FILMS

CROSS REFERENCE TO RELATED APPLICATIONS

This application is a division of application Ser. No. 15/072,887, filed on Mar. 17, 2016. All of the above-referenced applications are hereby incorporated herein by reference in their entirety.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. As transistor device size shrinks with each technology generation, existing BSI image sensor devices may begin to suffer from issues related to cross-talk and blooming. These issues may be caused by insufficient isolation between neighboring pixels of the BSI image sensor.

Therefore, while existing methods of fabricating BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
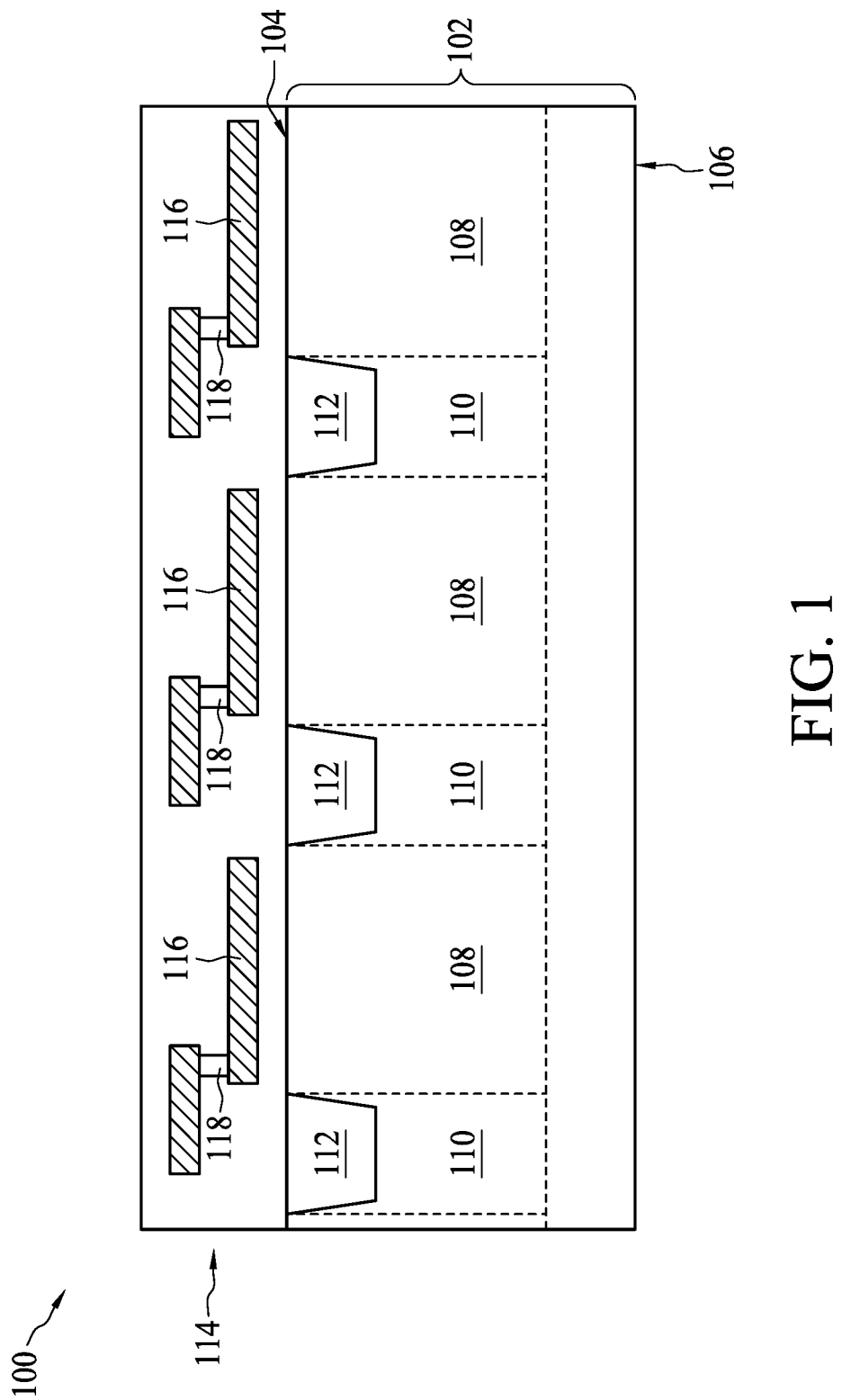
FIG. 1 to FIG. 7 are cross-sectional views of an image sensor device fabricated at various operations, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The image sensor device according to the present disclosure is a backside-illuminated (BSI) image sensor device. The BSI image sensor device includes a charge-coupled device (CCD), a complementary metal oxide semiconductor (CMOS) image sensor (CIS), an active-pixel sensor (APS) or a passive-pixel sensor. The image sensor device may include additional circuitry and input/outputs that are provided adjacent to the grid of pixels for providing an operation environment of the pixels and for supporting external communication with the pixels.

FIG. 1 to FIG. 7 are cross-sectional views of an image sensor device fabricated at various operations, in accordance with some embodiments of the present disclosure. It is understood that FIG. 1 to FIG. 7 have been simplified for a better understanding of embodiments of the present disclosure.

Referring to FIG. 1, the image sensor device 100 includes a substrate 102. The substrate 102 is a device substrate. The substrate 102 may be a semiconductor substrate. The substrate 102 may be a silicon substrate doped with a P-type dopant such as boron, in which case the substrate 102 is a P-type substrate. Alternatively, the substrate 102 could be another suitable semiconductor material. For example, the substrate 102 may be a silicon substrate doped with an N-type dopant such as phosphorous or arsenic, in which case the substrate is an N-type substrate. The substrate 102 may include other elementary semiconductor materials such as germanium or diamond. The substrate 102 may optionally include a compound substrate and/or an alloy semiconductor. Further, the substrate 102 may include an epitaxial layer (epi layer), may be strained for performance enhancement, and may include a silicon-on-insulator (SOI) structure.

The substrate 102 has a front surface 104 (also referred to as a frontside) and a back surface 106 (also referred to as a backside). For a BSI image sensor device such as the image sensor device 100, incident radiation enters the substrate 102 through the back surface 106. In some embodiments, the substrate 102 has a thickness ranging from about 500 μm to about 100 μm. The substrate 102 is fabricated with front end processes, in accordance with some embodiments. For example, the substrate 102 includes various regions, which may include a pixel region, a periphery region, a bonding pad region, and a scribe line region. For the sake of simplicity, only a portion of the pixel region is shown in FIGS. 1 to 7.

The pixel region includes radiation-sensing regions 108 and doped isolation regions 110. The radiation-sensing regions 108 are doped with a doping polarity opposite from that of the substrate 102. The radiation-sensing regions 108 are formed by one or more implantation processes or diffusion processes. The radiation-sensing regions 108 are formed adjacent to or near the front surface 104 of the substrate 102. Although only a portion of the pixel region is shown in FIG. 1, the pixel region may further include pinned layer photodiodes, photodiode gates, reset transistors, source follower transistors, and transfer transistors. For the sake of simplicity, detailed structures of the above features are not shown in figures of the present disclosure.

The radiation-sensing regions 108 are operable to sense incident radiation that enters the pixel region from the back surface 106. The incident radiation may be visual light. Alternatively, the incident radiation may be infrared (IR), ultraviolet (UV), X-ray, microwave, other suitable types of radiation, or a combination thereof.

The doped isolation regions 110 are adjacent to the radiation-sensing regions 108, in accordance with some embodiments. The doped isolation regions 110 are formed adjacent to or near the front surface 104. Each pair of neighboring radiation-sensing regions 108 is separated from one another by one of the respective doped isolation regions 110. The doped isolation regions 110 are doped with a doping polarity the same as that of the substrate 102. In some embodiments, the doping concentration of the doped isolation regions 110 is higher than that of the substrate 102. For example, the doping concentration of the doped isolation regions 110 may be in a range of about 1E16 per $cm^3$ to about 1E20 per $cm^3$. The doped isolation regions 110 are formed by one or more implantation processes or diffusion processes.

As shown in FIG. 1, isolation features 112 are formed in the doped isolation regions 110, in accordance with some embodiments. The isolation features 112 are formed adjacent to or near the front surface 104 of the substrate 102. In some embodiments, the isolation features 112 are used to define predetermined regions of the radiation-sensing regions 108 and doped isolation regions 110. Therefore, the isolation features 112 may be formed before forming the radiation-sensing regions 108 and doped isolation regions 110. In some embodiments, the doped isolation regions 110 are aligned with the isolation features 112.

The isolation features 112 include shallow trench isolation (STI) structures and/or local oxidation of silicon (LOCOS) structures. In some embodiments, some active or passive features, such as MOSFET or junction capacitor, are formed in the doped isolation regions 110, according to design needs and manufacturing concerns. The active or passive features in the doped isolation regions 110 are surrounded and protected by the isolation features 112. The thickness of the isolation features 112 is greater than that of the active or passive features in the doped isolation regions 110. In some embodiments, the thickness of the isolation features 112 is in a range from about 100 angstroms to about 5000 angstroms.

In some embodiments, the isolation features 112 are formed by forming trenches in the substrate 102 from the front surface 104 and filling a dielectric material into the trenches. The dielectric material may include silicon oxide, silicon nitride, silicon oxynitride, a low-k material, or another suitable dielectric material. A chemical mechanical polishing (CMP) process may be performed to planarize the surface of the dielectric material filling the trenches.

As shown in FIG. 1, the image sensor device 100 may further include an interconnection structure 114 formed over the front surface 104 of the substrate 102. The interconnection structure 114 includes a number of patterned dielectric layers and conductive layers that couple to various doped features, circuitry, and input/output of the image sensor device 100. The interconnection structure 114 includes an interlayer dielectric (ILD) and a multilayer interconnection (MLI) structure. The MLI structure includes contacts, vias and metal lines. For the purpose of illustration, a number of conductive lines 116 and vias/contacts 118 are shown in FIG. 1, it being understood that the conductive lines 116 and vias/contacts 118 are merely exemplary. The actual positioning and configuration of the conductive lines 116 and vias/contacts 118 may vary depending on design needs and manufacturing concerns.

Figure 2:
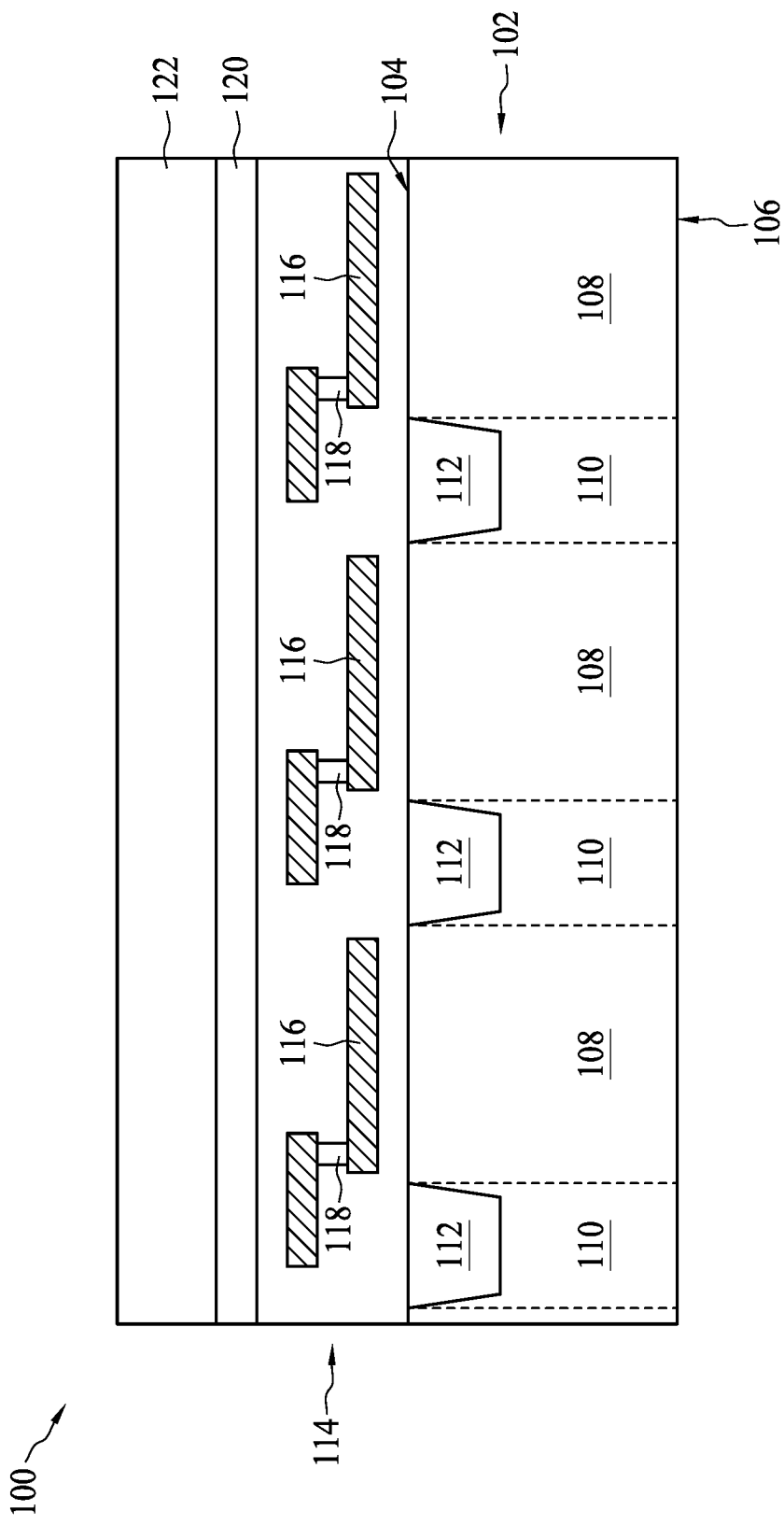

Referring to FIG. 2, a buffer layer 120 is formed on the interconnection structure 114, in accordance with some embodiments. The buffer layer 120 may include a dielectric material such as silicon oxide. Alternatively, the buffer layer 120 may include silicon nitride. The buffer layer 120 may be deposited by chemical vapor deposition (CVD), physical vapor deposition (PVD), or other suitable techniques. The buffer layer 120 may be planarized to form a smooth surface by a CMP process.

Afterwards, a carrier substrate 122 is bonded with the substrate 102 through the buffer layer 120. Therefore, the processing of the back surface 106 of the substrate 102 can be performed. In some embodiments, the carrier substrate 122 is similar to the substrate 102 and includes a silicon material. Alternatively, the carrier substrate 122 may include a glass substrate or another suitable material. The carrier substrate 122 may be bonded to the substrate 102 by molecular forces (direct bonding), optical fusion bonding, metal diffusion bonding, anodic bonding, or by other suitable bonding techniques. The buffer layer 120 provides electrical isolation between the substrate 102 and carrier substrate 122. The carrier substrate 122 provides protection for the various features formed on the front surface 104 of the substrate 102. The carrier substrate 122 also provides mechanical strength and support for processing the back surface 106 of the substrate 102 as discussed below.

After the carrier substrate 122 is bonded, a thinning process is then performed to thin the substrate 102 from the back surface 106. The thinning process may include a mechanical grinding process. Afterwards, an etching chemical may be applied over the back surface 106 of substrate 102 to further thin the substrate 102 to a thickness which is on the order of a few microns. In some embodiments, the thickness of the substrate 102, after being thinned, is in a range from about 1 µm to about 100 µm.

Common image sensor device defects include optical cross-talk, electrical cross-talk and dark current. The defects become more serious as the image pixel sizes and the spacing between neighboring image pixels continues to shrink. Optical cross-talk refers to photon interference from neighboring pixels that degrades the light-sensing reliability and accuracy of the pixels. Dark current may be defined as the existence of pixel current when no actual illumination is present. In other words, the dark current is the current that flows through the photodiode when no photons are entering the photodiode. White pixels occur where an excessive amount of current leakage causes an abnormally high signal from the pixels. In the image sensor device 100 shown in FIG. 2, the doped isolation regions 110 have a doping polarity opposite to that of the radiation-sensing regions 108 to reduce the dark current and white pixel defects. However, the doped isolation regions 110 alone may not effective enough to prevent dark current and white pixel defects. In addition, the doped isolation regions 110 could not resolve the optical cross-talk defect due to the similar refractive index of the radiation-sensing regions 108 and doped isolation regions 110.

Figure 3:
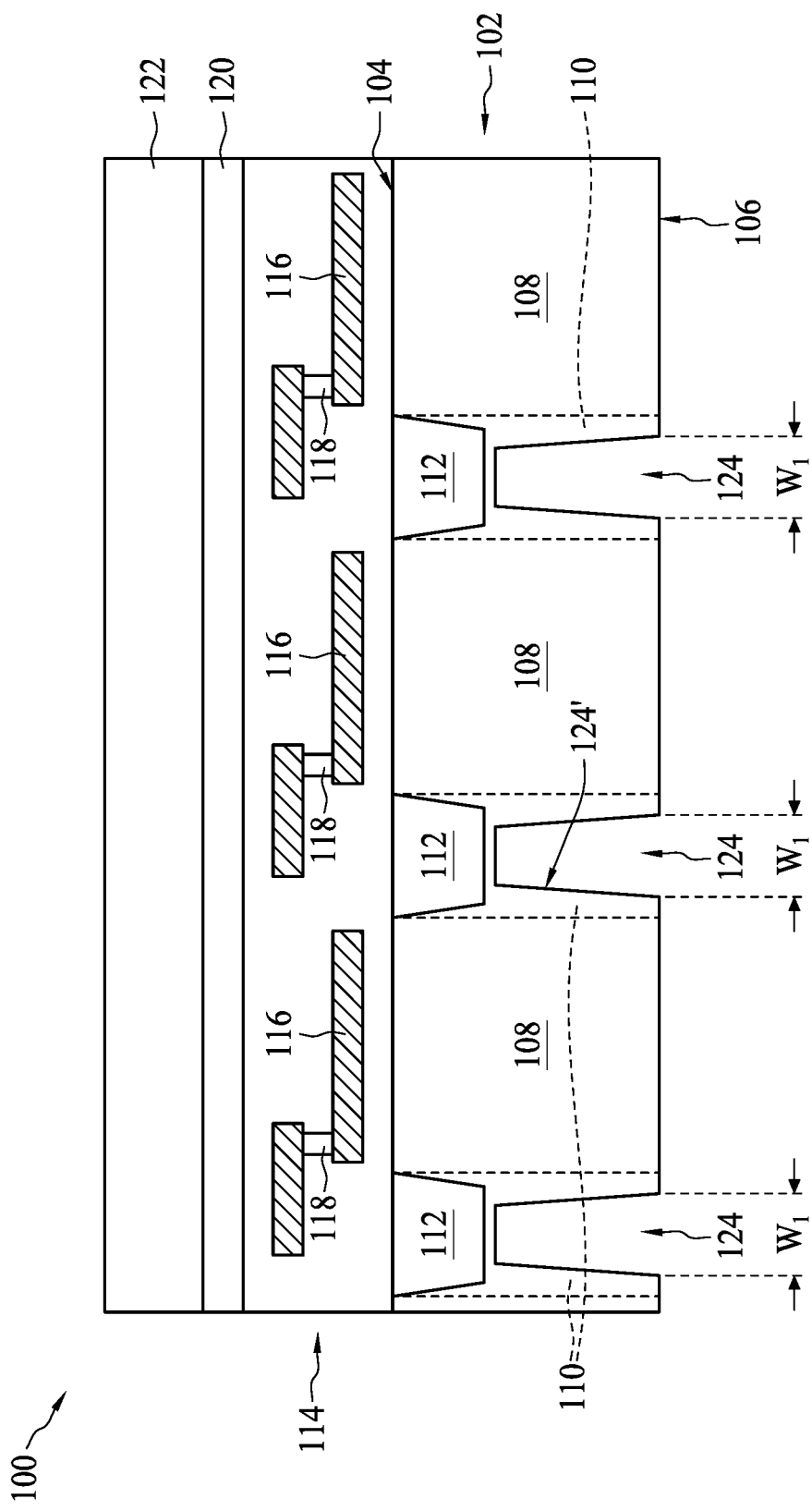

Referring to FIG. 3, an etching process is performed on the back surface 106 of the substrate 102 to form a number of openings 124 (or trenches/recesses). The etching process includes a dry etching process. An etching mask (for example a hard mask, not illustrated herein) may be formed before the etching process is performed. Each of the openings 124 has a width W1 at the back surface 106 of the substrate 102. The width W1 may be smaller than or substantially equal to that of the doped isolation regions 110. The openings 124 may have a rectangular shape, a trapezoidal shape, or other suitable shape. In some embodiments, each of the openings 124 extends over half of the thickness of the substrate 102 but does not reach the isolation features 112. Accordingly, active or passive features surrounded by the isolation features 112 may be not damaged by the etching process. In some embodiments, the depth of the openings 124, measured from the back surface 106 of the substrate 102, is in a range from about 1 µm to about 10 µm. The depth of the openings 124 may be adjusted by time control without using an etching stop layer. These openings 124 are used for forming deep-trench isolation (DTI) structures, which will be discussed in more detail below. At the completion of the openings 124 formation, an interior surface 124' of the DTI structure in the substrate 102 is exposed.

Figure 4A:
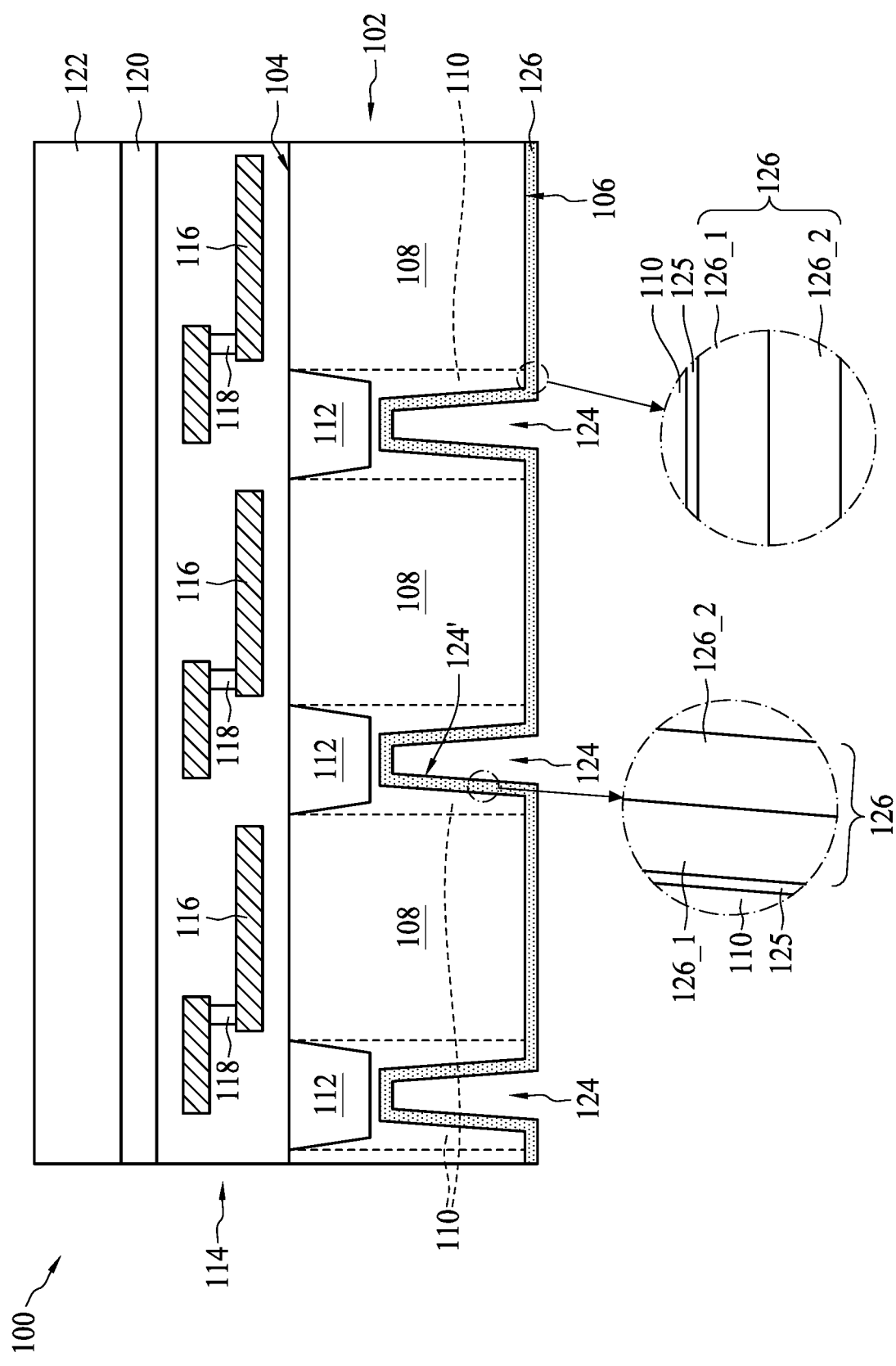

Referring to FIG. 4A, a high-k film 126 is formed over the interior surface 124' of the DTI structure, in accordance with an exemplary embodiment of the present disclosure. In some embodiments, as can be seen from the locally enlarged portion of the high-k film 126, a thin interlayer 125 consisting of e.g. $SiO_2$ can be applied between the substrate 102 and the high-k film 126 as an adhesion-promoting layer. The thickness of the interlayer 125 may be preferably less than about 25 angstroms. In some embodiments, the thickness of the interlayer 125 may be about 20 angstroms. The high-k film 126 may further cover the back surface 106. In the exemplary embodiment, the high-k film 126 effectively possesses a greater overall surface negative charge at one side of the interior surface 124' than that of traditional dielectric films. The effective surface negative charge induces effective surface positive charges at the other side of the interior surface 124' of the DTI structure. The induced effective surface positive charges annihilate negatively-charged crystal defects inherently residing in the proximity of the interior surface 124' due to damages made during the opening 124 formation. Hence, such arrangement of the high-k film 126 reduces dark current and/or white pixels in an image sensor device 100.

According to one or more embodiments, the high-k film 126 is a high-k metal oxide including an XO high-k layer and a YO high-k layer. X and Y are two elements on periodic table, O is oxygen. In particular, the XO high-k layer and the YO high-k layer may be a combination of at least two of a hafnium oxide, aluminum oxide, zirconium oxide, magnesium oxide, calcium oxide, yttrium oxide, tantalum oxide, strontium oxide, titanium oxide, lanthanum oxide, barium oxide or other metal oxides that can form a high-k film using existing semiconductor deposition technologies. In addition, the sequential arrangement of the XO high-k layer and the YO high-k layer is determined in accordance to the electro-negativities of the X and the Y with respect to their oxide form. For example, the element among X and Y having greater electronegativity is disposed closer to the substrate 102. On the other hand, the element among X and Y having lower electronegativity is disposed farther from the substrate 102. In this connection, the high-k film 126 demonstrates an electronegativity gradient with compounds having higher electronegativity element closer to the substrate 102 and compounds having lower electronegativity element farther from the substrate 102.

In the exemplary embodiment, the gradient high-k film 126 is comprised of an aluminum oxide ($Al_2O_3$) layer 126_1 and a hafnium oxide ($HfO_2$) layer 126_2. In some embodiments, the thickness of the aluminum oxide ($Al_2O_3$) layer 126_1 may be greater than about 30 angstroms. In some embodiments, the thickness of the aluminum oxide ($Al_2O_3$) layer 126_1 may be about 60 angstroms. In some embodiments, the thickness of the hafnium oxide ($HfO_2$) layer 126_2 may be greater than about 30 angstroms. In some embodiments, the thickness of the hafnium oxide ($HfO_2$) layer 126_2 may be about 60 angstroms.

The aluminum in the aluminum oxide ($Al_2O_3$) layer 126_1 has a stronger tendency to attract electrons (or electron density) towards itself than the hafnium in the hafnium oxide ($HfO_2$) layer 126_2 does. The gradient configuration of high-k layers can help to mitigate crystal defects causing dark current and white pixel. In particular, the disclosed gradient high-k film 126 having the configuration of the high-k layers alternatingly arranged in a sequentially stacked manner (i.e. the aluminum oxide ($Al_2O_3$) layer 126_1 on the thin interlayer 125 and further the hafnium oxide ($HfO_2$) layer 126_2 on the aluminum oxide ($Al_2O_3$) layer 126_1) can dramatically reduce the dark current and white pixel compared to the existing single layer dielectric film.

Figure 8:
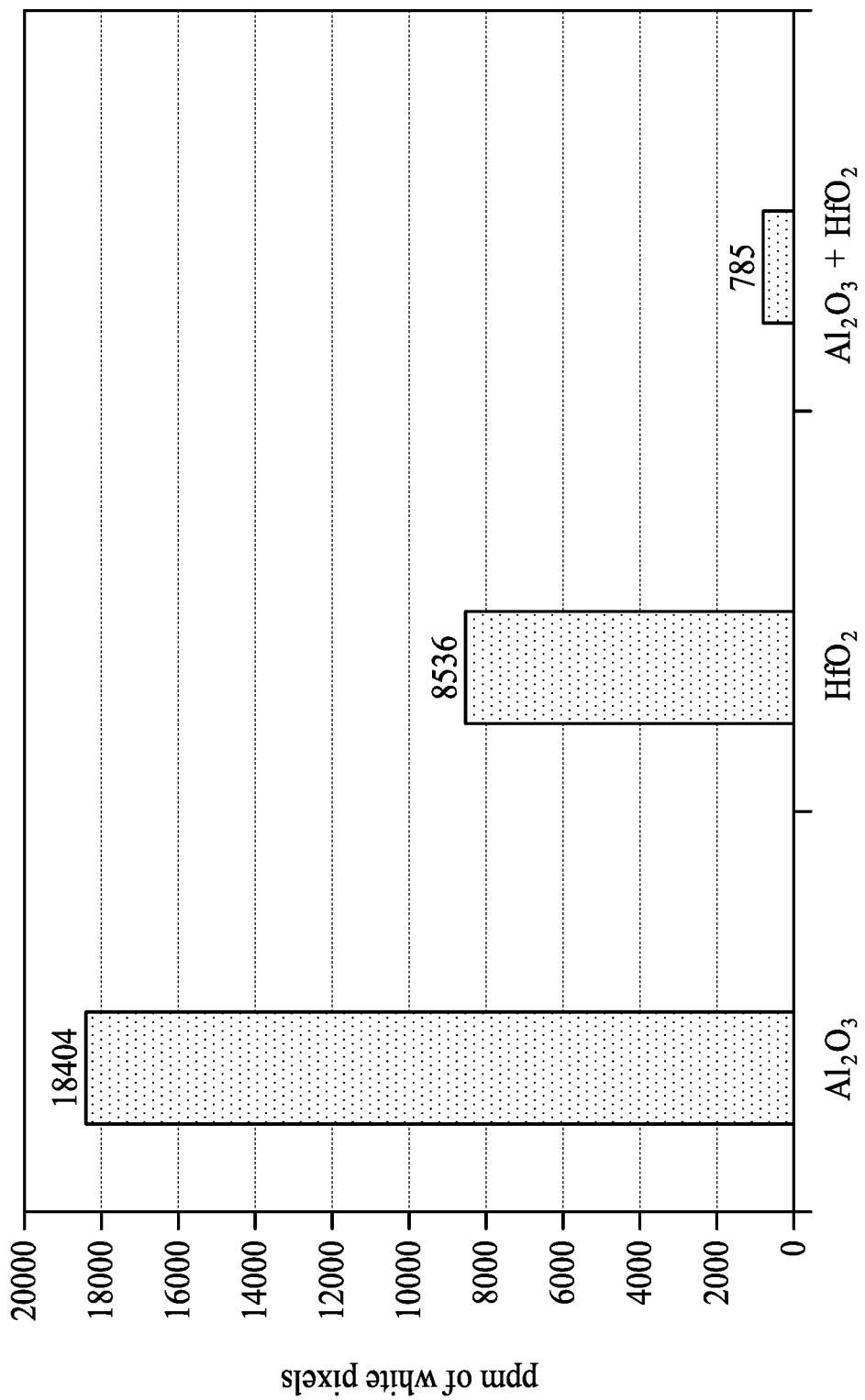
FIG. 8 is a schematic view showing the experiment results of testing the number of white pixels of devices fabricated according to the processes in the prior arts and the exemplary embodiment of FIG. 4A.

FIG. 8 is a schematic view showing the experiment results of testing the number of white pixels of devices fabricated according to the processes in the prior arts and the exemplary embodiment of FIG. 4A. From FIG. 8, it can be known that compared with the prior arts in which a single layer of hafnium oxide ($HfO_2$) or aluminum oxide ($Al_2O_3$) is formed over the back surface of the image sensor device, the gradient high-k film 126 comprised of the hafnium oxide ($HfO_2$) layer 126_2 and the aluminum oxide ($Al_2O_3$) layer 126_1 significantly reduces the number of the white pixels, thus greatly improving the pixel performance of the image sensor device 100.

The high-k metal oxide may be deposited using a CVD process or a PVD process. The CVD process may be plasma enhanced chemical vapor deposition (PECVD) including ICPECVD, a low pressure chemical vapor deposition (LPCVD), or an atomic layer deposition (ALD) with or without plasma. These processes may be tuned to favor an accumulation of negative charge by varying the process parameters including various flow rates and power parameters, and may involve a treatment step after the film deposition to increase negative charge. The resulting high-k metal oxide film may have an oxygen-rich composition with negatively charged interstitial oxygen atoms and/or dangling/broke metal oxide bonds, both of which results in a cumulated negative charge.

Figure 4B:
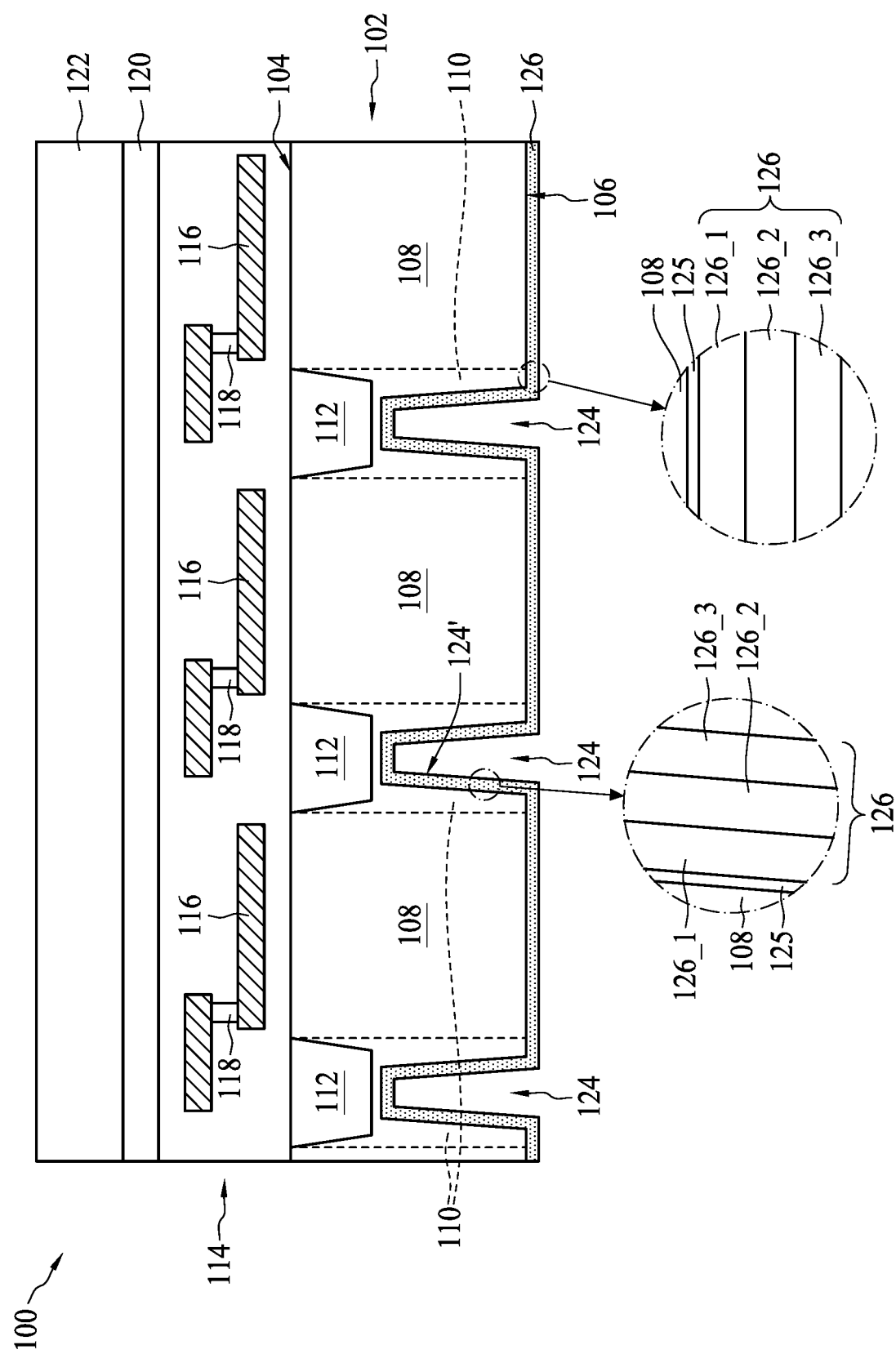

FIG. 4B illustrates the gradient high-k film 126 being formed over the back surface 106 of substrate 102 and the interior surface 124' of the DTI structure, in accordance with another embodiment of the present disclosure. Similar to FIG. 4A, as can be seen from the locally enlarged portion of the gradient high-k film 126, the thin interlayer 125 consisting of e.g. $SiO_2$ can be applied between the substrate 102 and the gradient high-k film 126 as adhesion-promoting layer. The thickness of the interlayer 125 may be preferably less than about 25 angstroms. In some embodiments, the thickness of the interlayer 125 may be about 20 angstroms. The gradient high-k film 126 may conformally cover the back surface 106, including covering interior surfaces 124' of the openings 124 in a conformal manner. The gradient high-k film 126 is comprised of the aluminum oxide ($Al_2O_3$) layer 126_1, the hafnium oxide ($HfO_2$) layer 126_2 and further a tantalum oxide ($Ta_2O_5$) layer 126_3. In some embodiments, the thickness of the aluminum oxide ($Al_2O_3$) layer 126_1 may be greater than about 10 to 30 angstroms. In some embodiments, the thickness of the aluminum oxide ($Al_2O_3$) layer 126_1 may be about 31 to 60 angstroms. In some embodiments, the thickness of the hafnium oxide ($HfO_2$) layer 126_2 may be about 10 to 30 angstroms. In some embodiments, the thickness of the hafnium oxide ($HfO_2$) layer 126_2 may be about 31 to 60 angstroms. In some embodiments, the thickness of the tantalum oxide ($Ta_2O_5$) layer 126_3 may be greater than about 10 to 30 angstroms. In some embodiments, the thickness of the tantalum oxide ($Ta_2O_5$) layer 126_3 may be about 31 to 60 angstroms.

The tantalum oxide ($Ta_2O_5$) layer 126_3 has a refractive index of about 2.2, which is greater than a refractive index (about 2) of the hafnium oxide ($HfO_2$) layer 126_2; and the refractive index of the hafnium oxide ($HfO_2$) layer 126_2 is also greater than a refractive index (about 1.6) of the aluminum oxide ($Al_2O_3$) layer 126_1. Moreover, the refractive index of the aluminum oxide ($Al_2O_3$) layer 126_1 is also greater than a refractive index (about 1.4-1.5) of the thin interlayer 125. The stacked layers of the thin interlayer 125, the aluminum oxide ($Al_2O_3$) layer 126_1, the hafnium oxide ($HfO_2$) layer 126_2 and the tantalum oxide ($Ta_2O_5$) layer 126_3 commonly form a gradient anti-reflective coating (ARC) in which layers of high-refractive index material and low-refractive-index material are alternatingly arranged in a sequentially stacked manner. The gradient high-k film 126 significantly increases the quantum efficiency (QE), light quality, light quantity into the radiation-sensing regions 108, and reduces the optical cross-talk between pixels.

Figure 9:
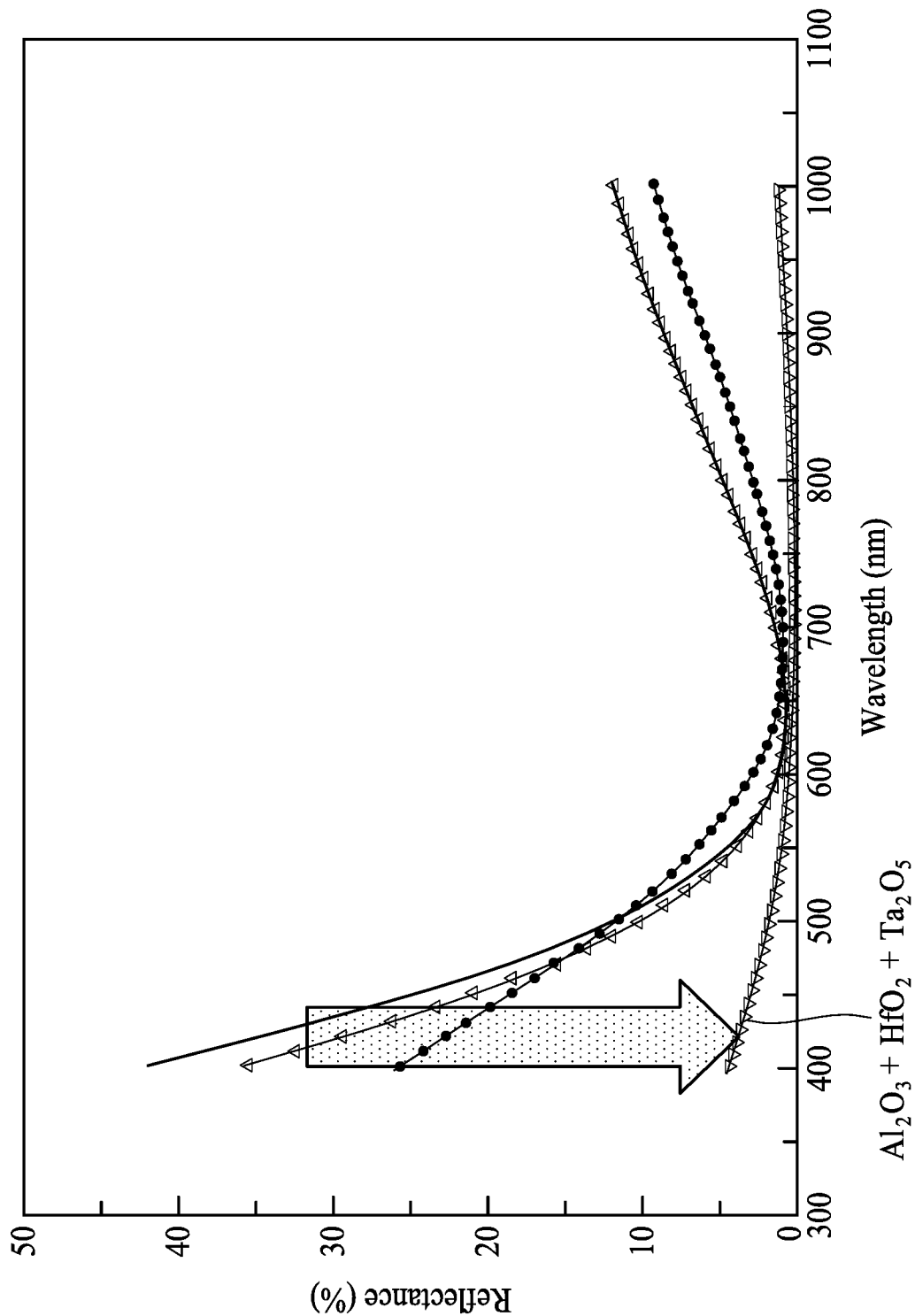
FIG. 9 is a schematic view showing the experiment results of testing the number of white pixels of devices fabricated according to the processes in the prior arts and the embodiment of FIG. 4B.

FIG. 9 is a schematic view showing the experiment results of testing the number of white pixels of devices fabricated according to the processes in the prior arts and the embodiment of FIG. 4B. From FIG. 9, it can be known that compared with the prior arts, the gradient high-k film 126 comprised of the tantalum oxide ($Ta_2O_5$) layer 126_3, the hafnium oxide ($HfO_2$) layer 126_2 and the aluminum oxide ($Al_2O_3$) layer 126_1 significantly reduces the reflectance in the wavelength band of about 400 nm to about 600 nm, thus greatly increasing the QE and reduces the optical cross-talk between pixels.

Figure 5:
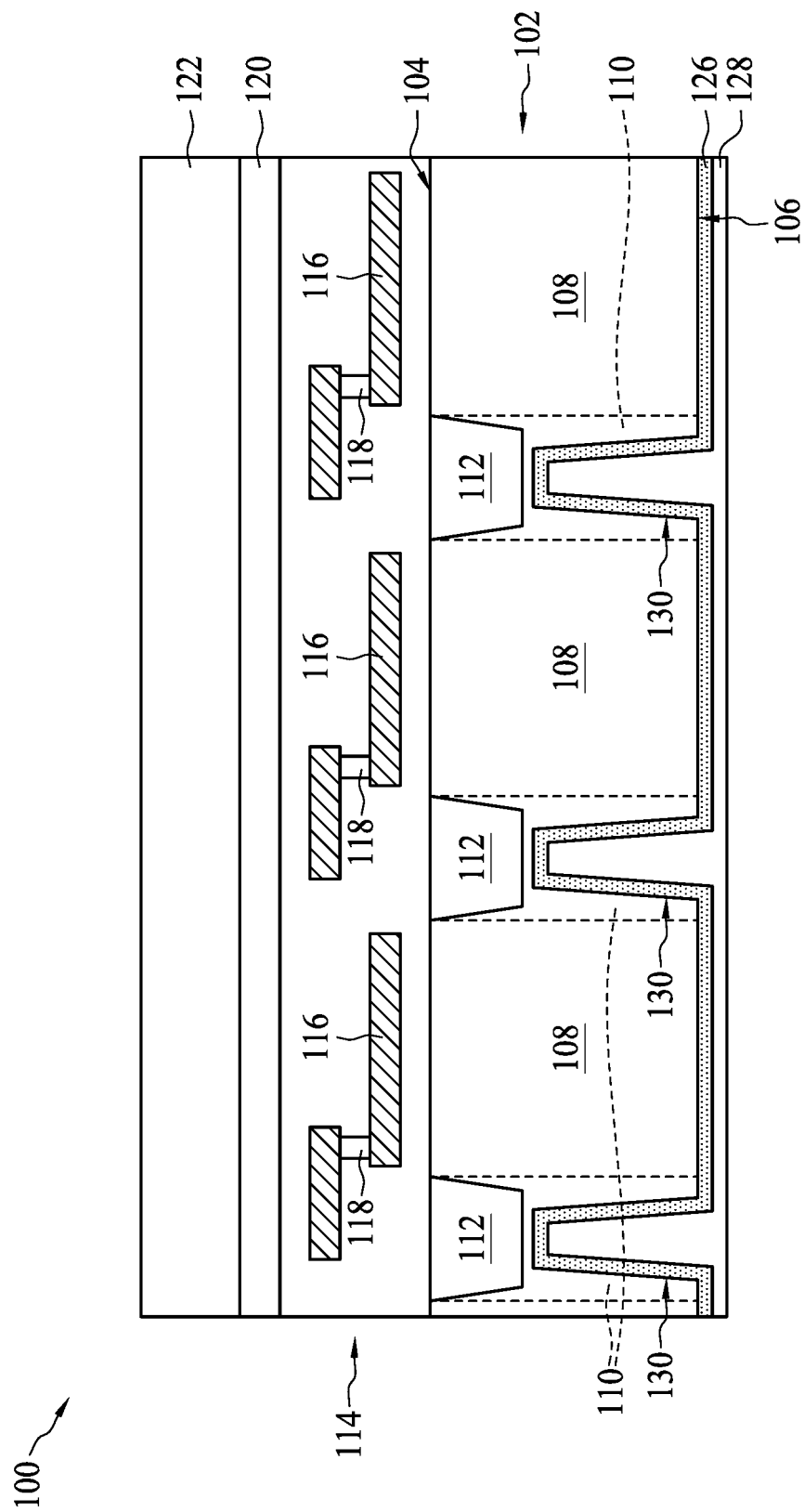

Afterwards, referring to FIG. 5, a dielectric material 128 is deposited over the back surface 106 of the substrate 102, in accordance with some embodiments. The dielectric material 128 fills the remaining spaces of the openings 124. In some embodiments, the dielectric material 128 includes silicon oxide, silicon nitride, silicon oxynitride, spin on glass (SOG), low-k dielectric, or another suitable dielectric material. The dielectric material 128 may be deposited by CVD, PVD, or another suitable depositing technique. In some embodiments, a portion of the dielectric material 128 outside the openings 124 is thinned and planarized. In the following discussion, the openings 124 and portions of the gradient high-k film 126 and dielectric material 128 in the openings 124 are collectively referred to as deep-trench isolation structures 130.

In some embodiment, a reflective grid (not shown) may be formed over the substrate 102 in order to prevent incident radiation from traveling into the deep-trench isolation structures thus reducing optical cross-talk defect. For example, the reflective grid may be formed on the dielectric material 128. Each piece of the reflective grid may be aligned with one of the respective deep-trench isolation structures 130. In some embodiments, the reflective grid may be formed of a metal material, such as aluminum, tungsten, copper, tantalum, titanium, alloys thereof, or combinations thereof. Each piece of the reflective grid may have a rectangular shape, a reverse trapezoidal shape, reverse triangle shape, or another suitable shape. The reflective grid may be formed by a suitable deposition process and then patterned. The deposition process includes electroplating, sputtering, CVD, PVD or other suitable depositing techniques. The CVD process may be a PECVD including ICPECVD, an LPCVD, or an ALD with or without plasma.

Figure 6:
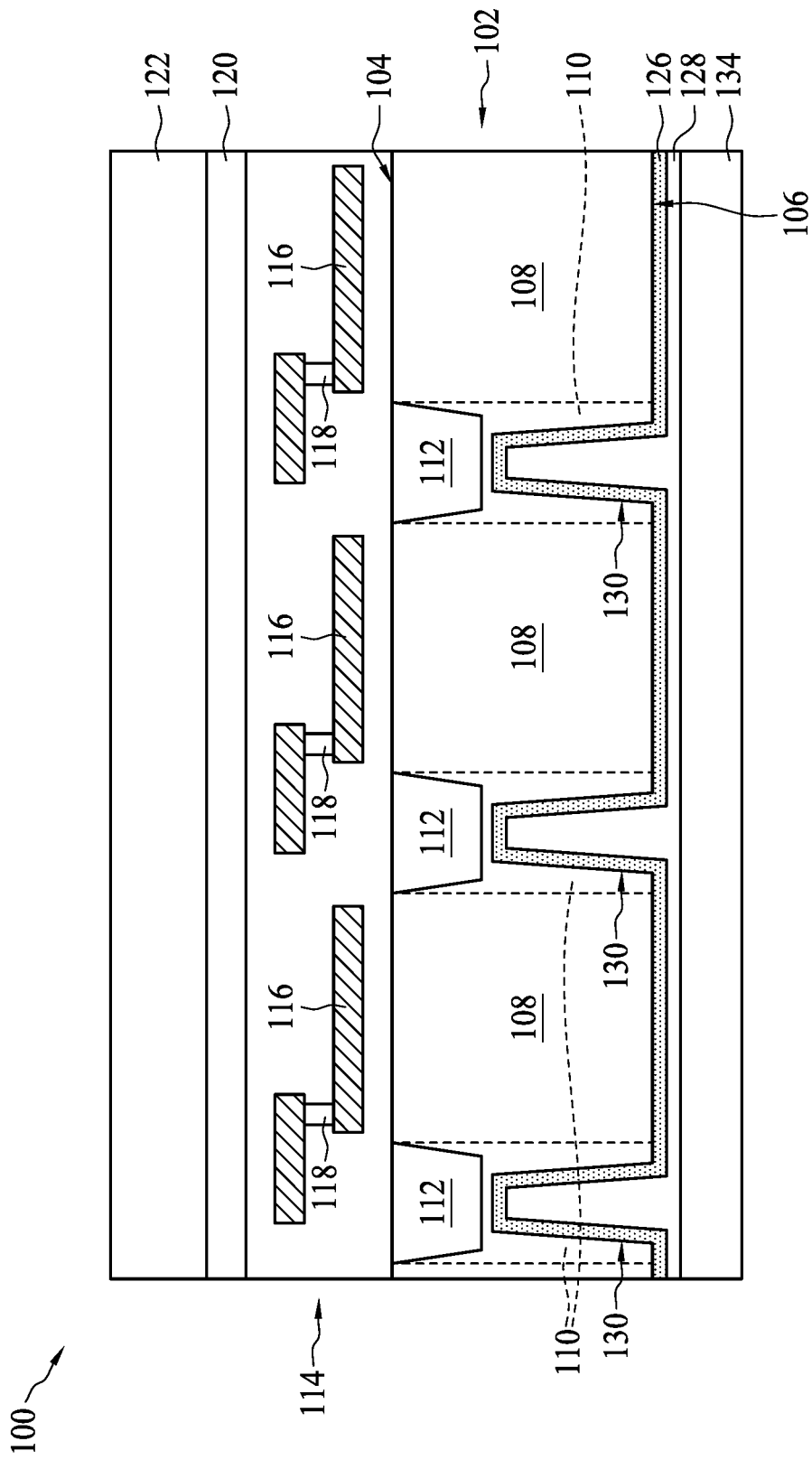

Afterwards, referring to FIG. 6, a transparent filling layer 134 is deposited over the back surface 106 of the substrate 102, in accordance with some embodiments. The transparent filling layer 134 may be made of silicon oxide, silicon nitride, or suitable polymers, and may be formed by suitable techniques, such as CVD, PVD, or combinations thereof. In some embodiments, the transparent filling layer 134 has a thickness ranging from about 10 angstroms to about 1000 angstroms. In some embodiments, the transparent filling layer 134 functions as an antireflective layer of the image sensor device 100. The antireflective layer serves to reduce reflection of the incident radiation projected toward the back surface 106 of the image sensor device 100.

Figure 7:
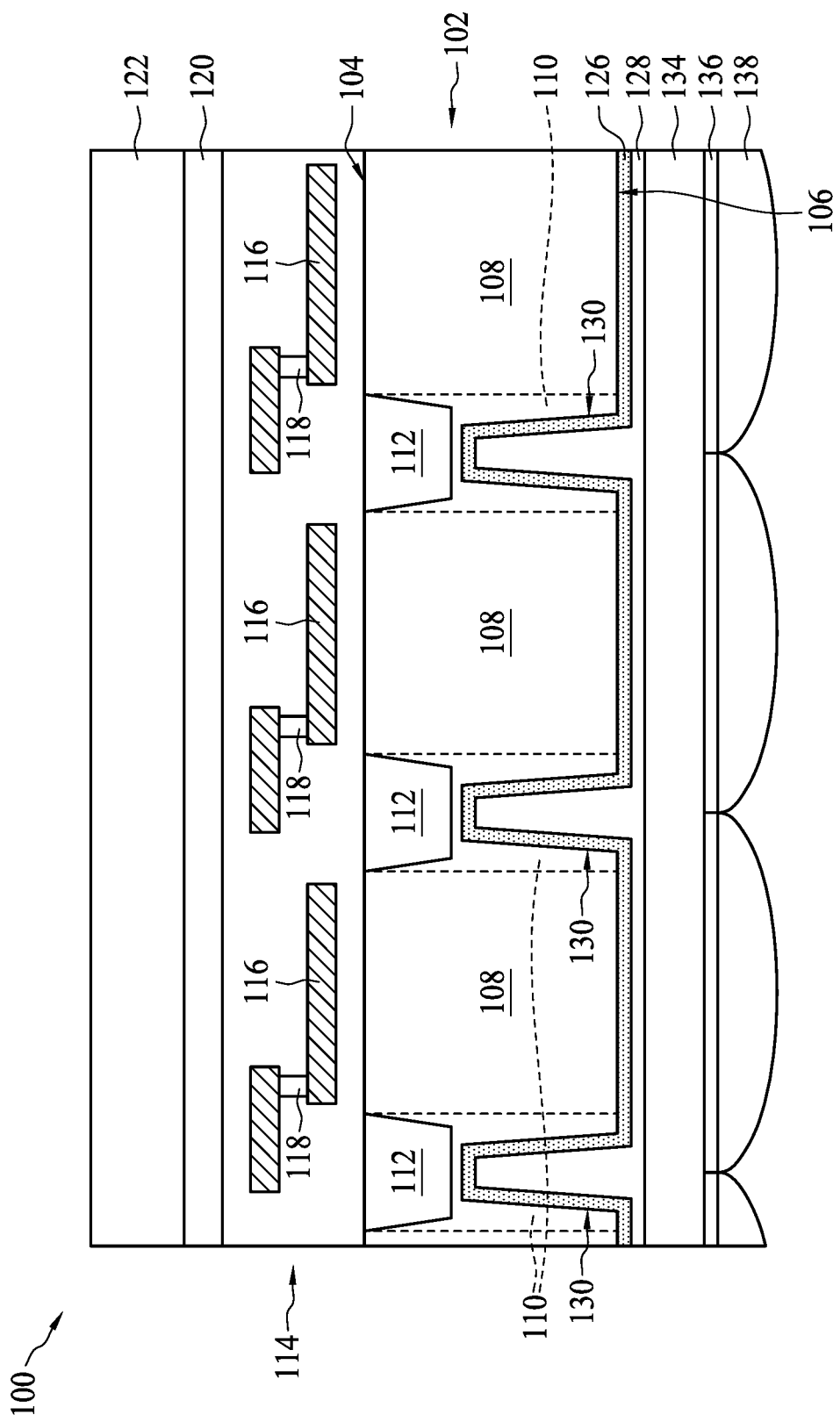

Thereafter, referring to FIG. 7, a color filter layer 136 is formed over the transparent filling layer 134, in accordance with some embodiments. The color filter layer 136 supports the filtering of incident radiation having a particular range of wavelengths, which may correspond to a particular color of light, for example, red, green, or blue. The color filter layer 136 may be used to allow only light having a predetermined color to reach of the radiation-sensing regions 108. Afterwards, a micro lens layer 138 may be formed over the color filter layer 136 for directing incident radiation toward the radiation-sensing regions. The micro lens layer 138 may be positioned in various arrangements and have various shapes depending on the refractive index of the material used for the micro lens layer 138 and/or the distance between the micro lens layer 138 and the radiation-sensing regions 108. Alternatively, the position of the color filter layer 136 and micro lens layer 138 may be reversed such that the micro lens layer 138 may be disposed between the back surface 106 of the substrate 102 and color filter layer 138.

Embodiments of mechanisms for forming an image sensor device are described. The gradient high-k film comprised of materials of different negative charges and refractive indexes alternatingly arranged in a sequentially stacked manner, can significantly reduce the dark current and white pixel defects, and further improve the QE.

Some embodiments of the present disclosure provide an image sensor device. The image sensor device includes: a substrate having a front surface and a back surface; a radiation-sensing region formed in the substrate; an opening extending from the back surface of the substrate into the substrate; a first metal oxide film including a first metal, the first metal oxide film being formed on an interior surface of the opening; and a second metal oxide film including a second metal, the second metal oxide film being formed over the first metal oxide film; wherein the electronegativity of the first metal is greater than the electronegativity of the second metal.

Some embodiments of the present disclosure provide an image sensor device. The image sensor device includes: a substrate having a front surface and a back surface; a radiation-sensing region formed in the substrate; an opening extending from the back surface of the substrate into the substrate: and a film having gradient refractive indexes over an interior surface of the opening; wherein the film includes a plurality of layers alternatingly arranged in a sequentially stacked manner according to refractive indexes, and a layer of the plurality of layers closer to the substrate has a lower refractive index than a layer of the plurality of layers farther from the substrate does.

Some embodiments of the present disclosure provide a method of fabricating an image sensor device. The method includes: providing a substrate having a front surface and a back surface; forming a radiation-sensing region adjacent to the front surface; forming an opening in the substrate from the back surface; and forming a first metal oxide film including a first metal on an interior surface of the opening; forming a second metal oxide film including a second metal over the first metal oxide film; wherein the electronegativity of the first metal is greater than the electronegativity of the second metal.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An image sensor device, comprising:
a substrate having a front surface and a back surface;
two adjacent radiation-sensing regions formed in the substrate;
an opening extending from the back surface of the substrate into the substrate;
a trench isolation feature formed of dielectric material extending from the front surface of the substrate into the substrate between the two adjacent radiation-sensing regions;
a first metal oxide film including a first metal, the first metal oxide film being formed on an interior surface of the opening;
a second metal oxide film including a second metal, the second metal oxide film being formed over the first metal oxide film; and
a third metal oxide film including a third metal, the third metal oxide film being formed over the second metal oxide film;
wherein the electronegativity of the first metal is greater than the electronegativity of the second metal, and the electronegativity of the second metal is greater than the electronegativity of the third metal, and each of the first metal oxide film, the second metal oxide film, and the third metal oxide film is stacked up from the substrate in a contiguous and conformal manner.

2. The image sensor device of claim 1, wherein the isolation feature abuts the front surface, and the first metal oxide film is conformally formed on an interior surface of the opening.

3. The image sensor device of claim 1, wherein the first metal includes aluminum.

4. The image sensor device of claim 1, wherein the second metal includes hafnium.

5. The image sensor device of claim 1, wherein the opening has a depth greater than 1.5 um.

6. The image sensor device of claim 1, wherein a thickness of each of the first metal oxide film and the second metal oxide film is greater than 30 Angstroms.

7. The image sensor device of claim 1, wherein the first metal oxide film is further conformally disposed over the back surface of the substrate.

8. The image sensor device of claim 1, further comprising an interlayer between the first metal oxide film and the interior surface of the opening.

9. The image sensor device of claim 8, wherein the interlayer includes $SiO_2$.

10. The image sensor device of claim 8, wherein a thickness of the interlayer is less than 25 μm.

11. The image sensor device of claim 1, further comprising a tantalum oxide ($Ta_2O_5$) layer formed over the second metal oxide film.

12. An image sensor device, comprising:
a substrate having a front surface and a back surface;
two adjacent radiation-sensing regions formed in the substrate;
a trench isolation feature formed of dielectric material extending from the front surface of the substrate into the substrate between the two adjacent radiation-sensing regions and abutting the front surface;
a trench extending from the back surface of the substrate into the substrate;
a first film including a first metal, the first film being formed on an interior surface of the trench;
a second film including a second metal, the second film being formed over the first film; and
a third film including a third metal, the third film being formed over the second film;
wherein the electronegativity of the first metal is greater than the electronegativity of the second metal, and the electronegativity of the second metal is greater than the electronegativity of the third metal, and each of the first film, the second film, and the third film is stacked up from the substrate in a contiguous and conformal manner.

13. The image sensor device of claim 12, wherein the first film is conformally formed on an interior surface of the trench.

14. The image sensor device of claim 12, wherein the first metal includes aluminum.

15. The image sensor device of claim 12, wherein the second metal includes hafnium.

16. The image sensor device of claim 12, wherein the trench has a depth greater than 1.5 um.

17. The image sensor device of claim 12, wherein a thickness of each of the first film and the second film is greater than 30 Angstroms.

18. The image sensor device of claim 12, wherein the first film is further conformally disposed over the back surface of the substrate.

19. An image sensor device, comprising:
a substrate having a front surface and a back surface;
two adjacent radiation-sensing regions formed in the substrate;
a trench extending from the back surface of the substrate into the substrate;
a trench isolation feature formed of dielectric material extending from the front surface of the substrate into the substrate between the two adjacent radiation-sensing regions; and
a plurality of metal oxide films sequentially stacked up on an interior surface of the trench in a contiguous and conformal manner, wherein a first metal oxide film of the plurality of metal oxide films has greater electronegativity than a second metal oxide film of the plurality of metal oxide films, and the first metal oxide film is closer to the interior surface of the trench than the second metal oxide film, and the second metal oxide film of the plurality of metal oxide films has greater electronegativity than a third metal oxide film of the plurality of metal oxide films, and the second metal oxide film is closer to the interior surface of the trench than the third metal oxide film, wherein each of the first metal oxide film, the second metal oxide film, and the third metal oxide film is stacked up from the substrate in a contiguous and conformal manner.

20. The image sensor device of claim 19, wherein the first metal oxide film is an aluminum oxide layer, the second metal oxide film is a hafnium oxide layer, and the third metal oxide film is a tantalum oxide layer.

* * * * *